United States Patent
Abe et al.

(10) Patent No.: US 9,390,858 B2
(45) Date of Patent: Jul. 12, 2016

(54) ELECTRONIC COMPONENT, METHOD OF MANUFACTURING THE SAME, AND MOUNT STRUCTURE OF ELECTRONIC COMPONENT

(71) Applicant: Murata Manufacturing Co., Ltd., Nagaokakyo-shi, Kyoto-fu (JP)

(72) Inventors: Hiroshi Abe, Nagaokakyo (JP); Yoshiyuki Nomura, Nagaokakyo (JP); Junichi Saito, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/667,928

(22) Filed: Mar. 25, 2015

(65) Prior Publication Data

US 2015/0287532 A1 Oct. 8, 2015

(30) Foreign Application Priority Data

Apr. 3, 2014 (JP) ................. 2014-077361
Apr. 3, 2014 (JP) ................. 2014-077362
Apr. 3, 2014 (JP) ................. 2014-077363
Apr. 3, 2014 (JP) ................. 2014-077364

(51) Int. Cl.
*H05K 1/16* (2006.01)
*H01G 4/224* (2006.01)
*H01G 2/06* (2006.01)
*H01G 4/232* (2006.01)
*H01G 4/30* (2006.01)
*H05K 3/34* (2006.01)

(52) U.S. Cl.
CPC ............. *H01G 4/224* (2013.01); *H01G 2/065* (2013.01); *H01G 4/232* (2013.01); *H01G 4/30* (2013.01); *H05K 3/3436* (2013.01); *H05K 2201/0769* (2013.01); *H05K 2201/10015* (2013.01); *H05K 2201/10636* (2013.01); *Y02P 70/611* (2015.11)

(58) Field of Classification Search
CPC ............. H01G 4/06; H01G 4/12; H01G 4/30; H01G 4/228; B05D 5/12; C09D 183/04
USPC ................... 174/260; 361/118, 306.3, 321.2; 427/58, 126.2; 528/27
See application file for complete search history.

(56) References Cited

U.S. PATENT DOCUMENTS

| | | | | |
|---|---|---|---|---|
| 2003/0016486 A1* | 1/2003 | Takahara | ................. | H01G 4/12 361/321.2 |
| 2004/0047104 A1* | 3/2004 | Takahara | ................. | H01G 4/30 361/118 |
| 2010/0302704 A1* | 12/2010 | Ogawa | ..................... | H01G 4/30 361/306.3 |
| 2011/0287176 A1* | 11/2011 | Saito | ...................... | H01G 2/103 427/126.2 |
| 2012/0169205 A1* | 7/2012 | Unger | ..................... | H01T 13/14 313/118 |

(Continued)

FOREIGN PATENT DOCUMENTS

WO 02/082480 A1 10/2002

*Primary Examiner* — Xiaoliang Chen
(74) *Attorney, Agent, or Firm* — Keating & Bennett, LLP (57) ABSTRACT

An electronic component includes a main body, first and second external electrodes, and a water-repellent film. The first and second external electrodes are provided on a portion of a surface of the main body. The water-repellent film is provided on another portion of the surface of the main body and on a surface of the first external electrode. The water-repellent film contains a non-cross-linked silicone resin. An angle of contact of water of about 25° C. with the water-repellent film is not less than about 100° and not greater than about 160°.

6 Claims, 2 Drawing Sheets

(56) References Cited

U.S. PATENT DOCUMENTS

2013/0123530 A1* 5/2013 Boehm .................. C07F 7/0852
556/423

2013/0141836 A1* 6/2013 Saito ...................... H01G 2/103
361/306.1

2013/0190470 A1* 7/2013 Marrot .................... C08G 77/38
528/27

* cited by examiner

ELECTRONIC COMPONENT, METHOD OF MANUFACTURING THE SAME, AND MOUNT STRUCTURE OF ELECTRONIC COMPONENT

BACKGROUND OF THE INVENTION

1. Field of the Invention

The present invention relates to an electronic component, a method of manufacturing the same, and a mount structure of an electronic component.

2. Description of the Related Art

Reduction in size and thickness has recently been accelerated in electronic devices such as a portable telephone and a portable music player. Concurrently, for example, reduction in size of an electronic component contained in an electronic device has also been demanded. Such electronic devices are used in various environments, and improvements in the reliability of electronic components in various environments have been desired.

As described in International Publication WO2002/082480, ion migration in an electronic component has recently given rise to a problem in some cases. Ion migration occurs, for example, as follows. A temperature difference between an electronic component and outside air causes condensation at a surface of the electronic component, and water droplets produced due to condensation form at the surface of the electronic component, a water film which connects external electrodes to each other. When a voltage is applied across the external electrodes of the electronic component in such a state, ionized metallic species is dissolved and precipitated from the external electrodes in the water film. This problem occurs more noticeably when the electronic component is mounted on a car placed in a severe environment. WO2002/082480 describes providing a water-repellent film between external electrodes in order to suppress the occurrence of ion migration. WO2002/082480 describes formation of a water-repellent film with the use of a cross-linked silane coupling agent which contains fluorine.

In general, an electronic component is used as being mounted on a mount substrate with the use of solder. However, an electronic component provided with a water-repellent film may have low mount ability.

SUMMARY OF THE INVENTION

Preferred embodiments of the present invention provide an electronic component with excellent mountability with the use of solder while the occurrence of ion migration is significantly reduced or prevented, a method of manufacturing the same, and amount structure of an electronic component.

An electronic component according to a preferred embodiment of the present invention includes an electronic component main body, first and second external electrodes, and a water-repellent film. The first and second external electrodes are provided on a portion of a surface of the electronic component main body. The water-repellent film is provided on another portion of the surface of the electronic component main body and a surface of the first external electrode. The water-repellent film contains a non-cross-linked silicone resin. An angle of contact of water of about 25° C. with the water-repellent film preferably is not less than about 100° and not greater than about 160°, for example.

An electronic component according to another preferred embodiment of the present invention includes an electronic component main body, first and second external electrodes, and a water-repellent film. The first and second external electrodes are provided on a portion of a surface of the electronic component main body. The water-repellent film is provided on another portion of the surface of the electronic component main body and a surface of the first external electrode. The water-repellent film contains a non-cross-linked silicone resin. The non-cross-linked silicone resin preferably has a weight-average molecular weight not less than about 7400 g/mol and not greater than about 8000 g/mol, for example.

An electronic component according to another preferred embodiment of the present invention includes an electronic component main body, first and second external electrodes, and a water-repellent film. The first and second external electrodes are provided on a portion of a surface of the electronic component main body. The water-repellent film is provided on another portion of the surface of the electronic component main body and a surface of the first external electrode. The water-repellent film is soluble in an organic solvent.

An electronic component according to another preferred embodiment of the present invention includes an electronic component main body, first and second external electrodes, and a water-repellent film. The first and second external electrodes are provided on a portion of a surface of the electronic component main body. The water-repellent film is provided on another portion of the surface of the electronic component main body and a surface of the first external electrode. The water-repellent film is soluble in a solvent contained in a solder flux.

An electronic component according to another preferred embodiment of the present invention includes an electronic component main body, first and second external electrodes, and a water-repellent film. The first and second external electrodes are provided on a portion of a surface of the electronic component main body. The water-repellent film is provided on another portion of the surface of the electronic component main body and a surface of the first external electrode. The water-repellent film preferably is a silicone resin film having a thickness not greater than about 200 nm, for example.

An outermost layer of each of the first and second external electrodes preferably contains at least one of Sn, Cu, and Ag.

The electronic component main body preferably includes first and second main surfaces extending along a length direction and a width direction, first and second side surfaces extending along the length direction and a thickness direction, and first and second end surfaces extending along the width direction and the thickness direction. On the second main surface, a tip end portion of the first external electrode and a tip end portion of the second external electrode are opposed to each other in the length direction. The water-repellent film is located on a portion of the second main surface, which is located between the tip end portion of the first external electrode and the tip end portion of the second external electrode.

The water-repellent film preferably extends across another portion of the surface of the electronic component main body and the surface of the first external electrode.

The water-repellent film preferably covers the entire surface of an exposed portion of the electronic component main body and each of the first and second external electrodes.

The solvent contained in the solder flux preferably is an organic solvent.

The organic solvent preferably includes at least one selected from the group consisting of an ether-based organic solvent, an alcohol-based organic solvent, a hydrocarbon-based organic solvent, a ketone-based solvent, an ester-based solvent, and a glycol-ether-based solvent.

The solvent preferably has a solubility parameter (an SP value) of not less than about 7.0 and not greater than about 14.0, for example.

The water-repellent film preferably is a silicone resin film having a thickness not greater than about 100 nm, for example.

The silicone resin film preferably contains a non-cross-linked silicone resin.

A method of manufacturing an electronic component according to another preferred embodiment of the present invention includes the steps of forming a first external electrode and a second external electrode on a portion of a surface of an electronic component main body and providing on another portion of the surface of the electronic component main body and a surface of the first external electrode, a water-repellent film containing a non-cross-linked silicone resin, of which an angle of contact with water of about 25° C. is not less than about 100° and not greater than about 160°, for example.

A method of manufacturing an electronic component according to another preferred embodiment of the present invention includes the steps of forming a first external electrode and a second external electrode on a portion of a surface of an electronic component main body and providing a water-repellent film containing a non-cross-linked silicone resin having a weight-average molecular weight not less than about 7400 g/mol and not more than about 8000 g/mol on another portion of the surface of the electronic component main body and a surface of the first external electrode, for example.

A method of manufacturing an electronic component according to another preferred embodiment of the present invention includes the steps of forming a first external electrode and a second external electrode on a portion of a surface of an electronic component main body and providing a water-repellent film soluble in an organic solvent on another portion of the surface of the electronic component main body and a surface of the first external electrode.

A method of manufacturing an electronic component according to another preferred embodiment of the present invention includes the steps of forming a first external electrode and a second external electrode on a portion of a surface of an electronic component main body and providing a water-repellent film soluble in a solvent contained in a solder flux on another portion of the surface of the electronic component main body and a surface of the first external electrode.

In the step of providing a water-repellent film, the water-repellent film preferably is provided by immersing the electronic component main body having the first and second external electrodes formed in a treatment solution containing the non-cross-linked silicone resin, followed by drying.

A mount structure of an electronic component according to a preferred embodiment of the present invention includes the electronic component described above, amount substrate, and solder. The electronic component is mounted on the mount substrate. The solder joins the electronic component and the mount substrate to each other.

A water-repellent film preferably is not provided at a junction between the electronic component and the mount substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component, a method of manufacturing the same, and amount structure of an electronic component according to various preferred embodiments of the present invention will be described hereinafter with reference to the drawings. In the description of the preferred embodiments below, the same or corresponding elements in the drawings have the same reference characters allotted and description thereof will not be repeated. A drawing referred to in a preferred embodiment is schematic. A scale of a dimension of an object drawn in the drawings may be different from a scale of a dimension of an actual object. A scale of a dimension of an object may be different between the drawings. A specific scale of a dimension of an object should be determined with reference to the description below.

First Preferred Embodiment

Figure 1:
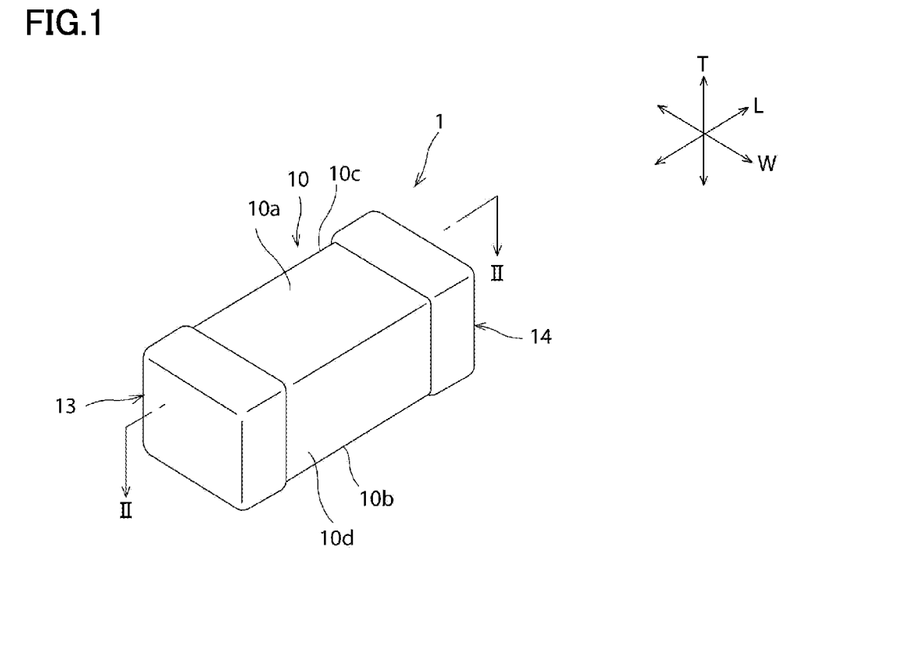
FIG. 1 is a perspective view showing an appearance of an electronic component according to a first preferred embodiment of the present invention.
Figure 2:
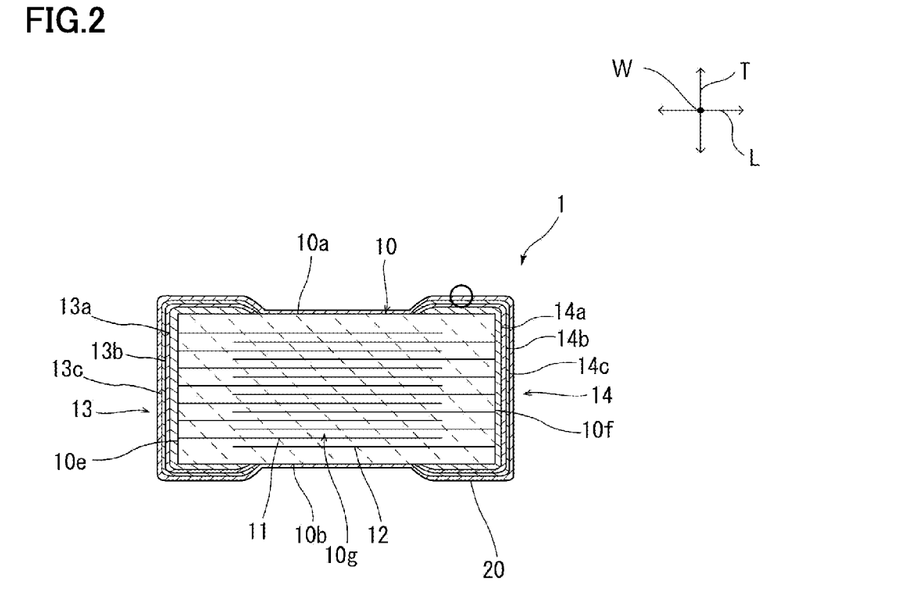
FIG. 2 is a cross-sectional view of the electronic component in FIG. 1 viewed in a direction of an arrow II-II.

FIG. 1 is a perspective view showing an electronic component according to a first preferred embodiment of the present invention. FIG. 2 is a cross-sectional view of the electronic component in FIG. 1 viewed in a direction of an arrow II-II. FIG. 1 does not depict a water-repellent film 20.

As shown in FIGS. 1 and 2, an electronic component 1 includes an electronic component main body 10 preferably having a parallelepiped or substantially parallelepiped shape. An electronic component main body 10 includes first and second main surfaces 10a and 10b, first and second side surfaces 10c and 10d, and first and second end surfaces 10e and 10f. Each of the first and second main surfaces 10a and 10b extends along a length direction L and a width direction W. Each of the first and second side surfaces 10c and 10d extends along a thickness direction T and a length direction L. Each of the first and second end surfaces 10e and 10f extends along a thickness direction T and a width direction W. The length direction L, the width direction W, and the thickness direction T are orthogonal to one another.

In preferred embodiments of the present invention, a "parallelepiped" includes a parallelepiped of which corner portions or ridge line portions are rounded. That is, a member in a "parallelepiped" shape includes a member including first and second main surfaces, first and second side surfaces, and first and second end surfaces in general. Projections and recesses may be provided in a portion or in the entirety of the main surfaces, the side surfaces, and the end surfaces.

A dimension of the electronic component main body 10 is not particularly limited. For example, a dimension of a thickness of the electronic component main body 10 is preferably not less than about 0.1 mm and not greater than about 3.0 mm, a dimension of a length of the electronic component main body 10 is preferably not less than about 0.2 mm and not greater than about 3.5 mm, and a dimension of a width of the electronic component main body 10 is preferably not less than about 0.1 mm and not greater than about 3.5 mm.

The electronic component main body 10 contains ceramics as appropriate in accordance with a function of the electronic component 1. Specifically, when the electronic component 1 functions as a capacitor, the electronic component main body 10 preferably contains dielectric ceramics. Specific examples of dielectric ceramics include BaTiO3, CaTiO3, SrTiO3, CaZrO3, and other suitable dielectric ceramics. To the electronic component main body 10, for example, a subcomponent such as an Mn compound, an Mg compound, an Si compound, an Fe compound, a Cr compound, a Co compound, an Ni compound, a rare-earth compound, and other suitable subcomponents may be added as appropriate, in accordance with characteristics required of electronic component 1.

When the electronic component 1 is a piezoelectric component, the electronic component main body 10 preferably contains piezoelectric ceramics. Piezoelectric ceramics are specifically exemplified by PZT (lead zirconate titanate)-based ceramics, for example.

When the electronic component 1 is, for example, a thermistor, the electronic component main body 10 preferably contains semiconductor ceramics. Semiconductor ceramics are specifically exemplified by spinel-type ceramics, for example.

When the electronic component 1 is, for example, an inductor, the electronic component main body 10 preferably contains magnetic ceramics. Magnetic ceramics are specifically exemplified by ferrite ceramics, for example.

As shown in FIG. 2, a plurality of first internal electrodes 11 and a plurality of second internal electrodes 12 are provided in the electronic component main body 10. Each of the first internal electrodes 11 preferably have a rectangular or substantially rectangular shape in a plan view. The first internal electrodes 11 are provided in parallel or substantially in parallel to each of the first and second main surfaces 10a and 10b. That is, the first internal electrodes 11 are provided along the length direction L and the width direction W. The first internal electrodes 11 are exposed at the first end surface 10e and not exposed at the first and second main surfaces 10a and 10b, the first and second side surfaces 10c and 10d, and the second end surface 10f.

Each of the second internal electrodes 12 preferably has a rectangular or substantially rectangular shape in a plan view. The second internal electrodes 12 are provided in parallel or substantially in parallel to each of the first and second main surfaces 10a and 10b. That is, the second internal electrodes 12 are provided along the length direction L and the width direction W. The second internal electrodes 12 are exposed at the second end surface 10f. The second internal electrodes 12 are not exposed at the first and second main surfaces 10a and 10b, the first and second side surfaces 10c and 10d, and the first end surface 10e.

The first and second internal electrodes 11 and 12 are provided alternately along the thickness direction T. The first internal electrodes 11 and the second internal electrodes 12 adjacent to each other in the thickness direction T are opposed to each other with a ceramic portion 10g interposed therebetween. The ceramic portion 10g preferably has a thickness approximately not less than about 0.5 µm and not greater than about 10 µm, for example.

Each of the first and second internal electrodes 11 and 12 is composed of an appropriate conductive material. Each of the first and second internal electrodes 11 and 12 is preferably composed, for example, of a metal selected from the group consisting of Ni, Cu, Ag, Pd, and Au or an alloy containing one or more metals selected from the group consisting of Ni, Cu, Ag, Pd, and Au (for example, an Ag—Pd alloy). Each of the first and second internal electrodes 11 and 12 preferably has a thickness, for example, of approximately not less than about 0.3 µm and not greater than about 2.0 µm.

The electronic component 1 further includes a first external electrode 13 and a second external electrode 14. The first external electrode 13 and the second external electrode 14 are provided on a portion of the surface of electronic component main body 10. Specifically, the first external electrode 13 extends across the entire surface of the first end surface 10e and a portion of the surface of each of the first and second main surfaces 10a and 10b and the first and second side surfaces 10c and 10d. The first external electrode 13 is electrically connected to the first internal electrode 11 at the first end surface 10e.

The second external electrode 14 extends across the entire surface of the second end surface 10f and a portion of the surface of each of the first and second main surfaces 10a and 10b and first and the second side surfaces 10c and 10d. The second external electrode 14 is electrically connected to the second internal electrode 12 at the second end surface 10f.

In each of the first and second main surfaces 10a and 10b and the first and second side surfaces 10c and 10d, a tip end portion of the first external electrode 13 in the length direction L and a tip end portion of the second external electrode 14 in the length direction L are opposed to each other in the length direction L.

An outermost layer of the first external electrode 13 preferably contains at least one of Sn, Cu, and Ag, for example. Specifically, the first external electrode 13 includes a first electrode layer 13a, a second electrode layer 13b, and a third electrode layer 13c.

The first electrode layer 13a is provided on a portion of the surface of the electronic component main body 10. The first electrode layer 13a is defined by a fired electrode layer. The fired electrode layer refers to an electrode layer obtained by firing a paste layer obtained by applying a paste containing conductive particles. The conductive particles contained in the fired electrode layer may preferably be, for example, particles containing at least one of Cu, Ni, Ag, Pd, an Ag—Pd alloy, and Au.

The second electrode layer 13b is provided on a surface of the first electrode layer 13a. The second electrode layer 13b may preferably be defined by a plated layer. In the present preferred embodiment, the second electrode layer 13b is preferably defined by a Ni plated layer.

The third electrode layer 13c is provided on a surface of the second electrode layer 13b. The third electrode layer 13c may preferably be defined by a plated layer. In the present preferred embodiment, the third electrode layer 13c preferably is defined by a Sn plated layer.

An outermost layer of the second external electrode 14 preferably contains at least one of Sn, Cu, and Ag. Specifically, the second external electrode 14 includes a first electrode layer 14a, a second electrode layer 14b, and a third electrode layer 14c.

The first electrode layer 14a is provided on a portion of the surface of the electronic component main body 10. The first electrode layer 14a is preferably defined by a fired electrode layer. The fired electrode layer refers to an electrode layer obtained by firing a paste layer obtained by applying a paste containing conductive particles. The conductive particles contained in the fired electrode layer may preferably be, for example, particles containing at least one of Cu, Ni, Ag, Pd, an Ag—Pd alloy, and Au.

The second electrode layer 14b is provided on a surface of the first electrode layer 14a. The second electrode layer 14b may preferably be defined by a plated layer. In the present preferred embodiment, the second electrode layer 14b preferably is defined by a Ni plated layer.

The third electrode layer 14c is provided on a surface of the second electrode layer 14b. The third electrode layer 14c may preferably be defined by a plated layer. In the present preferred embodiment, the third electrode layer 14c is preferably defined by a Sn plated layer.

The electronic component 1 further includes a water-repellent film 20. The water-repellent film 20 is a solid of a polymer containing a non-cross-linked silicone resin but not containing a cross-linking agent. The water-repellent film 20 may be defined by only a non-cross-linked silicone resin or may be defined by a resin composition containing a filler, for example.

The non-cross-linked silicone resin is preferably made of a silicone oligomer or a silicone polymer not containing a cross-linking agent, and further preferably made of a solution in which a silicone polymer is dispersed in an organic solvent. As a silicone oligomer or a silicone polymer not containing a cross-linking agent, for example, a material having a trade name such as FZ-3704, BY16-846, SF8416, SH203, 230FLUID, SF8419, and SF8422 (all of which are manufactured by Dow Corning Toray), XC96-B0446, XR31-B1410, XR31-B2230, and XC96-C2813 (all of which are manufactured by Momentive Performance Materials Japan LLC), and KC-89S, KR-500, X-40-9225, X-40-9246, X-40-9250, KR-9218, K213, and KR-510 (all of which are manufactured by Shin-Etsu Chemical Co., Ltd.) can be used alone or in combination. A preferable filler is exemplified by silica particles, for example.

The water-repellent film 20 is provided on another portion of the surface of the electronic component main body 10 (on a surface of an exposed portion where the first and second external electrodes 13 and 14 are not provided) and on a surface of at least one of the first and second external electrodes 13 and 14. Thus, the formation of a water film on the electronic component main body 10 is significantly reduced or prevented. Therefore, the occurrence of ion migration is significantly reduced or prevented.

Ion migration accompanies ionization of a metallic component in an external electrode and migration of the ionized metallic component to an opposing electrode. Therefore, contact between the external electrode and moisture is preferably prevented so as to prevent the occurrence of ion migration. Accordingly, in order to more effectively prevent the occurrence of ion migration, the water-repellent film 20 preferably covers at least a portion of the first and second external electrodes 13 and 14. The water-repellent film 20 more preferably covers the tip end portions of the first and second external electrodes 13 and 14. The water-repellent film 20 further preferably extends across the surface of at least one of the first and second external electrodes 13 and 14 and the surface of the electronic component main body 10.

In order to prevent ions generated at one of the first and second external electrodes 13 and 14 from reaching the other of the external electrodes, the water-repellent film 20 is preferably provided on at least one of the first and second main surfaces 10a and 10b and the first and second side surfaces 10c and 10d, so as to separate the first external electrode 13 and the second external electrode 14 from each other.

The water-repellent film 20 further preferably covers the entire surface of the exposed portion of the electronic component main body 10 and the first and second external electrodes 13 and 14. Here, the water-repellent film 20 covering the entire surface of the exposed portion of the electronic component main body 10 and the first and second external electrodes 13 and 14 indicates that the water-repellent film 20 covers about 90% or more of the entire surface of the exposed portion of the electronic component main body 10 and the first and second external electrodes 13 and 14. For example, in a case in which the water-repellent film 20 is made of a silicone resin, when the exposed portion of the electronic component main body 10 and the first and second external electrodes 13 and 14 are subjected to Si mapping in a field of view of about 50 μm$^2$ with the use of time-of-flight secondary ion mass spectrometry (TOF-SIMS), ions including Si are detected from a portion covered with the water-repellent film 20. Namely, the water-repellent film 20 covering the entire surface of the exposed portion of the electronic component main body 10 and the first and second external electrodes 13 and 14 indicates that, in an analysis with TOF-SIMS, ions including Si are detected in a portion occupying about 90% or more of the entire surface of the exposed portion of the electronic component main body 10 and the first and second external electrodes 13 and 14.

Figure 3:
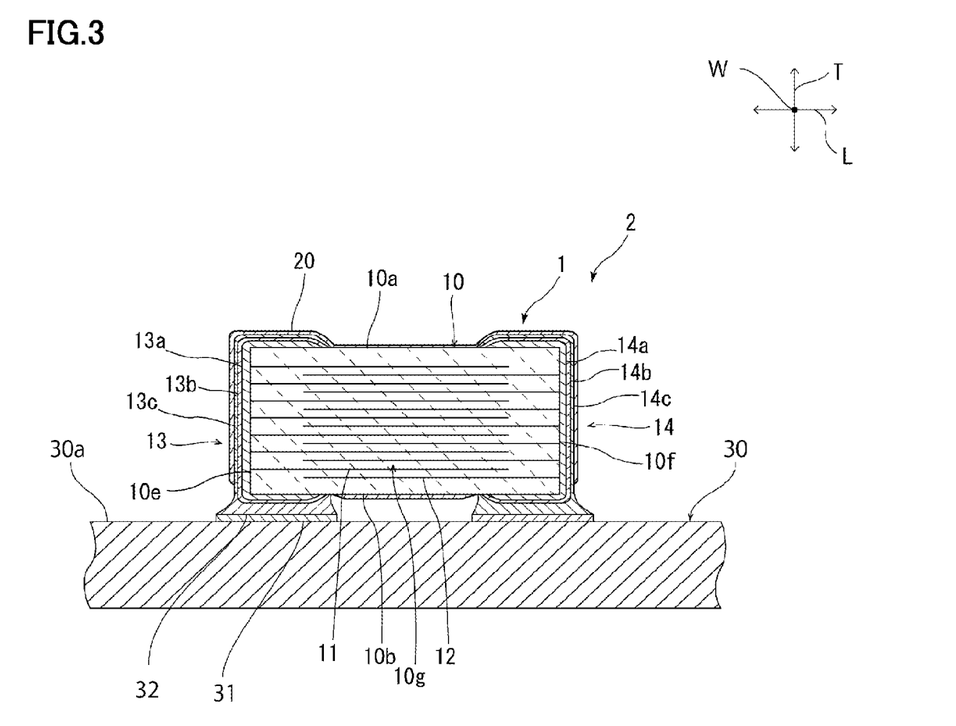
FIG. 3 is a cross-sectional view of a mount structure of an electronic component according to the first preferred embodiment of the present invention.

FIG. 3 is a cross-sectional view of a mount structure of an electronic component according to the first preferred embodiment of the present invention. As shown in FIG. 3, a mount structure 2 of the electronic component includes the electronic component 1, a mount substrate 30, and solder 32. The electronic component 1 is mounted on the mount substrate 30. A land 31 provided on a mount surface 30a of the mount substrate 30 and the first and second external electrodes 13 and 14 are joined to each other by solder 32. A solder member 32 (for example, a solder ball) includes solder and a solder flux. The solder flux contains a solvent. The solvent contained in the solder flux may be an aqueous solvent or an organic solvent.

For example, when a surface of the electronic component main body is modified with a cross-linked silane coupling agent, there is an upper limit to an amount of the silane coupling agent per unit area with which the surface can be modified. In particular, as a water-repellent group having a long straight chain is introduced in order to obtain an excellent liquid repellent property, steric hindrance between adjacent silane coupling agents is more significant, and thus, an amount of silane coupling agent per unit area with which the surface of the electronic component main body can be modified decreases. Therefore, it is difficult to modify the surface densely with the silane coupling agent having a water-repellent group with a long straight chain.

Specifically, as a straight chain of a water-repellent group of the silane coupling agent is increased in length, steric hindrance is more significant and repulsive force between straight chains of the silane coupling agent is increased. Therefore, since an interval between the straight chains of the silane coupling agent inevitably increases, the capability to cover an electrode portion is reduced, moisture produced by condensation is more likely to form a water film, and ion migration may occur through the generation process described above.

Since a treatment film formed with the silane coupling agent is provided on a surface of an electronic component in a state of an elementary substance (a monomer) having one Si (silicon) atom, a portion where monomers are not bonded to each other is produced. Therefore, it is difficult for the treatment film defined by the silane coupling agent to have a dense film structure. Accordingly, it is difficult to provide a dense water-repellent film if a surface of an electronic component main body is modified with a silane coupling agent.

International Publication WO2002/082480 proposed a method of providing high water repellency by using a silane coupling agent including F (fluorine) in a functional group. With this method, the length of a straight chain of a silane coupling treatment film can be reduced. However, even with the silane coupling treatment, there is a portion where bonding between silicon and silicon is insufficient. Thus, the capability to cover an electrode portion is insufficient in a silane coupling treatment film including F (fluorine) in a functional group, and resistance to ion migration cannot sufficiently be produced. A molecular weight of a water-repellent film including a cross-linked silane coupling agent is undesirably high. Therefore, it becomes difficult for the water-repellent film to be dissolved in a solvent contained in a solder flux. Therefore, when a water-repellent film includes a cross-linked silane coupling agent, the mountability of an electronic component is reduced.

In the electronic component 1, a water-repellent film 20 containing a non-cross-linked silicone resin is provided. This is because, by using a water-repellent film containing a non-cross-linked silicone resin as the water-repellent film 20, unlike a cross-linked silane coupling treatment film, no cross-linking reaction occurs during film formation, and thus, control of the number of repeating units in siloxane bond is facilitated and a molecular weight of a treatment agent is prevented from undesirably increasing. Thus, a problem in that the water-repellent film 20 is not dissolved in a solvent contained in a solder flux and the mountability of an electronic component being reduced are avoided, and a dense treatment film is provided. A water-repellent film containing a non-cross-linked silicone resin is preferably composed of a polymer constituted of such siloxane bond as being expressed as —Si—O—Si, and silicon is connected to form a high-polymer structure in a chain or lump. Therefore, a water-repellent film containing a non-cross-linked silicone resin has a dense structure. Thus, the water-repellent film 20 is denser and more water-repellent than a water-repellent film including a cross-linked silane coupling agent. Therefore, by providing the water-repellent film 20, as compared to a water-repellent film including a silane coupling agent, the occurrence of ion migration is effectively reduced or prevented.

Whether a water-repellent film is of a cross-linked type or a non-cross-linked type can be determined by heating a treatment agent used for the water-repellent film under a condition, for example, of about 150° C. for about 30 minutes and checking a molecular weight. Here, the determination of a non-cross-linked water-repellent film can be made when no increase in molecular weight as compared to a molecular weight before heating is observed.

However, the inventors of the present invention have unexpectedly discovered that the occurrence of ion migration cannot sufficiently be reduced or prevented in some cases even when the water-repellent film 20 containing a non-cross-linked silicone resin is provided. The inventors of the present invention have conducted further dedicated studies, and have surprisingly and unexpectedly discovered that, when an angle of contact of a water-repellent film with water of about 25° C. is increased, from a certain angle, an effect of reducing or preventing the occurrence of ion migration is drastically improved.

Then, in the present preferred embodiment, the water-repellent film 20 is provided such that an angle of contact (a static angle of contact) of water of about 25° C. with the water-repellent film 20 is not less than about 100° and not greater than about 160°, for example. Thus, the occurrence of ion migration is effectively reduced or prevented.

An angle of contact of water of about 25° C. with the water-repellent film 20 can be measured, for example, in the following manner, with the use of a microscopic contact angle meter (MCA-3 manufactured by Kyowa Interface Science Co., Ltd.). Initially, an electronic component is arranged on a horizontal base such that a second main surface faces the base. Then, an angle of contact of water of about 25° C. with the water-repellent film 20 can be determined by dropping water droplets at about 25° C. onto the water-repellent film 20 on a first main surface of the electronic component of which surface temperature is about 25° C. in an environment in which an ambient temperature of the electronic component is set to about 25° C., and thereafter photographing a water film formed on the main surface in a lateral direction. This angle of contact is a static angle of contact measured immediately after dropping.

As described above, in order to reduce or prevent the occurrence of ion migration, a water-repellent film is preferably also provided on a surface of at least one of the first and second external electrodes. However, as a result of dedicated studies conducted by the inventors of the present invention, it has been discovered that the mountability of an electronic component reduces when a water-repellent film includes a cross-linked silane coupling agent described in International Publication WO2002/082480. This is because, though treatment with a silane coupling agent containing fluorine (a perfluoroalkyl group) is performed in the technique described in International Publication WO2002/082480, fluorine has oil repellence and repels a flux in a solder paste, which has led to reduced wettability of solder during mounting and reduced mount ability.

In contrast, in the electronic component 1, the water-repellent film 20 contains a non-cross-linked silicone resin. The non-cross-linked silicone resin does not have oil repellence and blends well with a flux in a solder paste. In addition, unlike the silane coupling agent, the non-cross-linked silicone resin is not directly coupled to the first and second external electrodes 13 and 14. Therefore, since the water-repellent film 20 is dissolved in a solvent contained in a solder flux during mounting, it is readily removed from the surface of the first and second external electrodes 13 and 14. Accordingly, a solder melt and the first and second external electrodes 13 and 14 tend to be in direct contact with each other. Thus, the first and second external electrodes 13 and 14 and the solder 32 are suitably joined to each other. Therefore, the electronic component 1 has excellent mountability.

In the present preferred embodiment, an example in which the first external electrode 13 extends across the surface of the first end surface 10e and the surface of each of the first and second main surfaces 10a and 10b and the first and second side surfaces 10c an 10d is described. An example in which the second external electrode 14 extends across the surface of the second end surface 10f and the surface of each of the first and second main surfaces 10a and 10b and the first and second side surfaces 10c an 10d is described. The arrangement of the first and second external electrodes is not limited to the above-described arrangement, and for example, the first and second external electrodes may be provided only on the first and second end surfaces 10e and 10f of the electronic component main body 10. The first and second external electrodes may be provided only on the second main surface 10b of the electronic component main body 10. The first and second external electrodes may extend across the surfaces of the first and second end surfaces 10e and 10f and the surface of second main surface 10b of the electronic component main body 10. In the present preferred embodiment, an example in which an electronic component includes two external electrodes is described. The present preferred embodiment is not limited thereto, and an electronic component may include three or more external electrodes.

A method of manufacturing the electronic component 1 is not particularly limited. The electronic component 1 can be manufactured, for example, in the following manner. Initially, the electronic component main body 10 including the first and second internal electrodes 11 and 12 is prepared. The electronic component main body 10 can be manufactured with a known method. Specifically, the electronic component main body 10 can be manufactured, for example, in the following manner. Initially, a ceramic green sheet is prepared. Then, a conductive paste layer is formed by printing a conductive paste on the ceramic green sheet. Then, after a plurality of ceramic green sheets not including a conductive paste layer printed thereon are stacked, a ceramic green sheet including a conductive paste printed is stacked, and further thereon, a ceramic green sheet including a conductive paste layer printed thereon is stacked. A mother stack is thus fabricated. The mother stack may be pressed with isostatic pressing. Then, by cutting and dividing the mother stack in a plurality of pieces, a plurality of soft ceramic elements are fabricated. Then, the electronic component main body 10 can be completed by firing the soft ceramic elements.

Then, the first and second external electrodes 13 and 14 are formed on the surface of the electronic component main body 10. The first and second external electrodes 13 and 14 can be formed, for example, in the following manner. The first electrode layers 13a and 14a are formed by applying a conductive paste onto a portion of the surface of the electronic component main body 10 and baking the conductive paste. The second electrode layers 13b and 14b are formed on the surface of the first electrode layers 13a and 14a by providing Ni plating. The third electrode layers 13c and 14c are formed on the surface of the second electrode layers 13b and 14b by providing Sn plating. Through the steps described above, the first and second external electrodes 13 and 14 are formed.

Then, the water-repellent film 20 is formed on another portion of the surface of the electronic component main body 10 and the surface of the first and second external electrodes 13 and 14. Specifically, initially, a treatment agent is prepared by diluting a resin for forming the water-repellent film 20 with a solvent such as an alkane-based solvent, an isoparaffin-based solvent, or a xylene-based solvent. The water-repellent film 20 can be formed by immersing the electronic component main body 10 including first and second external electrodes 13 and 14 formed thereon in the treatment agent, followed by drying. Alternatively, a treatment agent may be applied to the electronic component main body 10 including first and second external electrodes 13 and 14 formed thereon. A concentration of a resin in a treatment agent is preferably, for example, not lower than about 1 mass % and not higher than about 50 mass %, more preferably not lower than about 3 mass % and not higher than about 50 mass %, and further preferably not lower than about 3 mass % and not higher than about 10 mass %. A time period of immersion in the treatment agent is, for example, approximately not shorter than about 1 minute and not longer than about 10 minutes. Regarding conditions for drying, for example, the electronic component main body is held, for example, at a temperature approximately not lower than about 100° C. and not higher than about 200° C. during a period approximately not shorter than 10 minutes and not longer than about 60 minutes.

An angle of contact of the water with water-repellent film 20 can be controlled, for example, by adjusting a material used for the water-repellent film 20 or a thickness of the water-repellent film 20. Normally, as the thickness of the water-repellent film 20 increases, an influence caused by underlying ceramics is less likely and, thus, an angle of contact of water with the water-repellent film 20 tends to be greater. A thickness of the water-repellent film 20 can be controlled, for example, by adjusting a concentration of a water-repellent resin in a treatment agent. Specifically, a thickness of water-repellent film 20 can be adjusted by using a treatment solution in which a concentration of a non-cross-linked resin is from about 1 mass % to about 60 mass %.

An Experimental Example 1 in which the influence of an angle of contact between water of about 25° C. and a water-repellent film on each of whether or not ion migration in an electronic component occurs and the mountability of an electronic component will be described below.

Experimental Example 1

In Experimental Example 1, nine types of electronic components and mount structures of the electronic components in Example 1 to Example 5 and Comparative Example 1 to Comparative Example 4 were fabricated. A stack ceramic capacitor was fabricated as the electronic component.

Example 1

An electronic component and a mount structure of the electronic component according to Example 1 substantially the same as the electronic component 1 according to the first preferred embodiment were fabricated under the conditions described below. A dimension (a design value) of the electronic component was set to about 1.6 mm in length, about 0.8 mm in width, and about 0.8 mm in thickness. A ceramic portion was composed of $BaTiO_3$. The first and second internal electrodes 11 and 12 were composed of Ni. The first electrode layers 13a and 14a were formed from a fired electrode layer containing Cu. The second electrode layers 13b and 14b were formed from a Ni plated layer. The third electrode layers 13c and 14c were formed from a Sn plated layer. A distance along the length direction between the first external electrode 13 and the second external electrode 14 in each of the first and second main surfaces 10a and 10b was set to about 0.8 mm. A liquid obtained by diluting a silicone polymer dispersion liquid containing a non-cross-linked silicone resin (SD-8002 DISPERSION manufactured by Dow Corning Toray) such that a concentration of the non-cross-linked silicone resin was about mass % was used as a treatment solution. For forming the water-repellent film 20, after the electronic component main body 10 including the first and second external electrodes 13 and 14 was immersed in the treatment solution for about 5 minutes, the electronic component main body was taken out of the treatment solution and dried at about 150° C. for about 30 minutes. Consequently, a water-repellent film having a thickness of approximately 5 nm was formed. The mount structure of the electronic component was fabricated by solder-mounting the electronic component on a substrate with the use of solder (96.5 Sn-3 Ag-0.5 Cu paste, M705-GRN360-K2-V manufactured by Senju Metal Industry Co., Ltd.).

Example 2

An electronic component and a mount structure of the electronic component according to Example 2 were fabricated as in Example 1 except that a concentration of the non-cross-linked silicone resin in the treatment solution was set to about 5 mass %. The formed water-repellent film had a thickness of approximately 50 nm.

Example 3

An electronic component and a mount structure of the electronic component according to Example 3 were fabricated as in Example 1 except that a concentration of the non-cross-linked silicone resin in the treatment solution was set to about 20 mass %. The formed water-repellent film had a thickness of approximately 100 nm.

Example 4

An electronic component and a mount structure of the electronic component according to Example 4 were fabricated as in Example 1 except that a concentration of the non-cross-linked silicone resin in the treatment solution was set to about 40 mass %. The formed water-repellent film had a thickness of approximately 200 nm.

Example 5

A non-cross-linked silicone resin (SD-8002 DISPERSION manufactured by Dow Corning Toray) was diluted with isoparaffin such that a concentration of the non-cross-linked silicone resin was about 5 mass %. A dispersion liquid was prepared by adding about 1.0 mass % of hydrophobic fumed silica (RX50 manufactured by Nippon Aerosil Co., Ltd. and having a BET specific surface area of 35 m$^2$/g) to the liquid resulting from dilution and dispersing silica with the use of an ultrasonic homogenizer. An electronic component and a mount structure of the electronic component according to Example 5 were fabricated as in Example 1 except that a water-repellent film was formed by using this dispersion liquid as a treatment solution. The formed water-repellent film had a thickness of approximately 5 nm.

Comparative Example 1

An electronic component and a mount structure of the electronic component according to Comparative Example 1 were fabricated as in Example 1 except that no water-repellent film was formed.

Comparative Example 2

An electronic component and a mount structure of the electronic component according to Comparative Example 2 were fabricated as in Example 1 except that a concentration of the non-cross-linked silicone resin in the treatment solution was set to about 0.1 mass %.

Comparative Example 3

An electronic component and a mount structure of the electronic component according to Comparative Example 3 were fabricated as in Example 1 except that a water-repellent film was formed with the use of a treatment solution obtained by diluting an alkoxysilane-based silane coupling agent (KBM-3063 manufactured by Shin-Etsu Chemical Co., Ltd.) with propanol to about 5 volume %.

Comparative Example 4

An electronic component and a mount structure of the electronic component according to Comparative Example 4 were fabricated as in Example 1 except that a water-repellent film was formed with the use of a treatment solution made of a fluorine-based silane coupling agent.

A measurement method and an evaluation method in the present Experimental Example will be described below.
Method of Measuring Thickness A method of measuring a thickness of a water-repellent film in a sample electronic component fabricated in each of Examples 1 to 5 and Comparative Examples 1 to 4 was performed as follows. Initially, in a main surface opposite to a mount surface of the electronic component (an LW surface), a cross-section of a water-repellent film was partially exposed by using a focused ion beam (FIB) emitted under a condition of an angle of about 45° with respect to a vertical direction such that a process range extending, starting from a central position in the width direction W and a central position in the length direction L (a portion circled in FIG. 2) of one external electrode along the length direction L formed on the LW surface, by about 30 μm along the length direction L toward the other external electrode and by about 30 μm along the thickness direction T is obtained. Then, a water-repellent film at the central position in the length direction L of the water-repellent film which was exposed at the exposed cross-section was projected with SEM and a thickness thereof was measured. The measurement value was adopted as a thickness of the water-repellent film.
Measurement of Angle of Contact Tables 1 and 2 show results of a measurement of an angle of contact of water of about 25° C. with the water-repellent film in the sample electronic component fabricated in each of Examples 1 to 5 and Comparative Examples 2 to 4. In Comparative Example 1 where no water-repellent film was formed, an angle of contact of water of about 25° C. with a main surface of the electronic component main body was measured. Table 1 shows results, with samples having achieved a target value being extracted from among a plurality of samples which had been fabricated to aim at each angle of contact shown in Table 1.
Evaluation of Ion Migration A cycle test for condensation in the mount structure of the electronic component in each of Examples 1 to 5 and Comparative Examples 1 to 4 was conducted under the following conditions. The fabricated mount structure of the electronic component was held for about 1 hour in an environment at a temperature as low as about −30° C. Thereafter, the mount structure was held for about 1 hour in an environment at a high temperature of about 25° C. and a high humidity of about 90%. Finally, the mount structure of the electronic component was dried while about 1.5 hour elapsed to lower humidity to about 50% at a temperature of about 25° C. This process was defined as 1 cycle and 48 cycles were carried out.

Thereafter, a portion of the second main surface was observed as being magnified by 100 times with the use of a microscope. Consequently, a casein which the presence of a white or black product was observed on the second main surface was determined as an occurrence of ion migration or "bad". A case in which a white or black product was not observed on the second main surface was evaluated as an absence of an occurrence of ion migration or "good". Tables 1 and 2 show a ratio of the number of samples determined as "bad" to the total number of samples ((the number of samples determined as "bad")/(the total number of samples)). Here, the number of tested samples was set to n=18.

Sn, Ni, or Cu could be detected as a result of analysis of a product with a wavelength-dispersive X-ray spectrometer (WDX). Therefore, the observed white or black product was confirmed as a product resulting from ion migration.
Evaluation of Mountability Mountability of the sample mount structure of the electronic component fabricated in each of Examples 1 to 5 and Comparative Examples 1 to 4 was evaluated with the use of a solder wettability tester "SAT-5100 manufactured by Rhesca Corporation" in accordance with JIS C 60068-2-69 "Environmental testing-Part 2-69: Tests-Test Te: Solderability testing of electronic components for surface mounting devices (SMD) by the wetting balance method."

Specifically, the electronic component was mounted on a glass epoxy substrate with unleaded solder (96.5 Sn-3 Ag-0.5 Cu). A solder pellet manufactured by Rhesca Corporation was used as the solder. A solution of about 25% of solid rosin (pine resin) and about 75% of isopropyl alcohol (IPA) (a weight ratio) was used as a flux. A temperature for the test was set to about 245° C. Based on the obtained test results, a sample of which zero crossing time (representing a time at which wetting starts) was within about 1.5 second was evaluated as "good" and a sample of which zero crossing time was equal to or greater than about 1.5 second was evaluated as "bad". Table 1 shows a ratio of the number of samples determined as "bad" to the total number of samples ((the number of samples determined as "bad")/(the total number of samples)). Here, the number of tested samples was set to n=10.

TABLE 1

| | Static Contact Angle Between Water-Repellent Film and Water at 25° C. (°) | Ratio of Occurrence of Ion Migration | Ratio of Defective Mountability |
|---|---|---|---|
| Comparative Example 1 | 82 | 18/18 | 0/10 |
| Comparative Example 2 | 95 | 9/18 | 0/10 |
| Example 1 | 100 | 2/18 | 0/10 |
| Example 2 | 110 | 0/18 | 0/10 |
| Example 3 | 120 | 1/18 | 0/10 |
| Example 4 | 130 | 1/18 | 0/10 |
| Example 5 | 160 | 0/18 | 0/10 |

TABLE 2

| | Static Contact Angle Between Water-Repellent Film and Water at 25° C. (°) | Ratio of Occurrence of Ion Migration | Ratio of Defective Mountability |
|---|---|---|---|
| Comparative Example 3 | 93 | 16/18 | 10/10 |
| Comparative Example 4 | 160 | 8/18 | 10/10 |

As shown in Table 1, a ratio of the occurrence of ion migration drastically changed, with an angle of contact of about 100° of water of about 25° C. with the water-repellent film defining a threshold. It could be confirmed from the results in the present Experimental Example that the occurrence of ion migration could suitably be reduced or prevented by setting an angle of contact of water of about 25° C. with the water-repellent film to about 100° or greater.

As shown in Table 2, when the water-repellent film was formed with the silane coupling agent, the occurrence of ion migration could not be sufficiently reduced or prevented even though an angle of contact of water of about 25° C. with the water-repellent film was set to about 100° or greater. It was discovered therefrom that the formation of a water-repellent film, of which the angle of contact of water of about 25° C. with the water-repellent film is about 100° or greater, with the use of a non-cross-linked silicone resin was important for effective reduction or preventions of the occurrence of ion migration. In addition, as shown in Table 2, mountability was not satisfactory when a water-repellent film was formed of a cross-linked silane coupling agent.

It was confirmed from the results described above that, by forming a water-repellent film, of which the angle of contact with water of about 25° C. was not less than about 100° and not greater than about 160°, with the use of a non-cross-linked silicone resin, the occurrence of ion migration could effectively be reduced or prevented and excellent mountability could be obtained.

An electronic component, a method of manufacturing the same, and a mount structure of the electronic component according to a second preferred embodiment of the present invention will be described below. Since the electronic component, the method of manufacturing the same, and the mount structure of the electronic component according to the present preferred embodiment are different from the electronic component, the method of manufacturing the same, and the mount structure of the electronic component according to the first preferred embodiment in that the occurrence of ion migration is reduced or prevented and good mountability with solder is achieved by defining a weight-average molecular weight of a non-cross-linked silicone resin contained in a water-repellent film, description of features the same as or similar to those in the first preferred embodiment will not be repeated.

Second Preferred Embodiment

In the second preferred embodiment of the present invention, a water-repellent film is provided such that an angle of contact (a static angle of contact) of water of about 25° C. with the water-repellent film is not less than about 90°, for example. A non-cross-linked silicone resin contained in the water-repellent film has a weight-average molecular weight not less than about 7400 g/mol and not more than about 8000 g/mol, for example.

An Experimental Example 2 in which the influence of a weight-average molecular weight of a non-cross-linked silicone resin on each of whether or not ion migration in an electronic component occurs and mountability of an electronic component will be described below.

Experimental Example 2

In Experimental Example 2, six types of electronic components and mount structures of the electronic components in Example 6 to Example 8 and Comparative Example 5 to Comparative Example 7 were fabricated. A stacked ceramic capacitor was fabricated as the electronic component.

Example 6

An electronic component and a mount structure of the electronic component according to Example 6 substantially the same as the electronic component according to the second preferred embodiment were fabricated under the conditions described below. A dimension (a design value) of the electronic component was set to about 1.6 mm in length, about 0.8 mm in width, and about 0.8 mm in thickness. A ceramic portion was composed of $BaTiO_3$. The first and second internal electrodes were composed of Ni. The first electrode layer was made of a fired electrode layer containing Cu. The second electrode layer was made of a Ni plated layer. The third electrode layer was made of a Sn plated layer. A distance along the length direction between the first external electrode and the second external electrode in each of the first and second main surfaces was set to about 0.8 mm. A liquid obtained by diluting a silicone polymer dispersion liquid (SD-8002 DISPERSION manufactured by Dow Corning Toray) containing a non-cross-linked silicone resin having a weight-average molecular weight not less than about 7400 g/mol and not more than about 8000 g/mol such that a concentration of the non-cross-linked silicone resin was about 1 mass % was used as the treatment solution. For forming a water-repellent film, after the electronic component main body 10 including the first and second external electrodes was immersed in the treatment solution for about 5 minutes, the electronic component main body was taken out of the treatment solution and dried at about 150° C. for about 30 minutes. Consequently, a water-repellent film having a thickness of approximately 5 nm was formed. The mount structure of the electronic component was fabricated by solder-mounting the electronic component on a substrate with the use of solder (96.5 Sn-3 Ag-0.5 Cu paste, M705-GRN360-K2-V manufactured by Senju Metal Industry Co., Ltd.).

Example 7

An electronic component and a mount structure of the electronic component according to Example 7 were fabricated as in Example 6 except that a concentration of the non-cross-linked silicone resin in the treatment solution was set to about 5 mass %. The water-repellent film had a thickness of approximately 50 nm.

Example 8

An electronic component and a mount structure of the electronic component according to Example 8 were fabricated as in Example 6 except that a concentration of the non-cross-linked silicone resin in the treatment solution was set to about 60 mass %. The formed water-repellent film had a thickness of approximately 250 nm.

Comparative Example 5

An electronic component and a mount structure of the electronic component according to Comparative Example 5 were fabricated as in Example 6 except that no water-repellent film was formed.

Comparative Example 6

An electronic component and a mount structure of the electronic component according to Comparative Example 6 were fabricated as in Example 6 except that a water-repellent film was formed with the use of a treatment solution obtained by diluting an alkoxysilane-based silane coupling agent (KBM-3063 manufactured by Shin-Etsu Chemical Co., Ltd.) with propanol to 5 volume %.

Comparative Example 7

An electronic component and a mount structure of the electronic component according to Comparative Example 7 were fabricated as in Example 6 except that a water-repellent film was formed with the use of a silicone-based cross-linked polymer coating liquid (KR-400 manufactured by Shin-Etsu Chemical Co., Ltd.). The formed water-repellent film had a thickness of approximately 5 μm.

A measurement method and an evaluation method in the present Experimental Example will be described below. Ion migration and mountability were evaluated as in Experimental Example 1.

Measurement of Weight-Average Molecular Weight

In each of Examples 6 to 8 and Comparative Example 6, three thousand samples were created. Three thousand samples were immersed in isoparaffin to thereby dissolve the water-repellent film in isoparaffin. To 10 g of tetrahydrofuran, 0.02 g of the isoparaffin solution in which the water-repellent film had been dissolved was added. Tetrahydrofuran to which the isoparaffin solution had been added was analyzed with a high performance liquid chromatograph (HPLC manufactured by Shimadzu Corporation) with a measurement mode being set to size exclusion chromatography (SEC), and a weight-average molecular weight was measured based on a result thereof.

Table 3 shows results of measurements of a weight-average molecular weight of the non-cross-linked silicone resin in the sample electronic component fabricated in each of Example 6 to Example 8 and Comparative Examples 6 and 7. In the sample fabricated in Comparative Example 7, the water-repellent film was not dissolved in isoparaffin. Therefore, a weight-average molecular weight of the water-repellent film of the sample electronic component according to Comparative Example 7 could not be measured.

TABLE 3

| | Weight-Average Molecular Weight of Non-Cross-Linked Silicone Resin (g/mol) | Ratio of Occurrence of Ion Migration | Ratio of Defective Mountability |
|---|---|---|---|
| Example 6 | 7400 | 0/18 | 0/10 |
| Example 7 | 8000 | 0/18 | 0/10 |
| Example 8 | 7800 | 0/18 | 0/10 |
| Comparative Example 5 | — | 18/18 | 0/10 |
| Comparative Example 6 | 260 | 16/18 | 0/10 |
| Comparative Example 7 | — | 0/18 | 10/10 |

As shown in Table 3, it was confirmed that, when a weight-average molecular weight of the non-cross-linked silicone resin was within a range not less than about 7400 g/mol and not more than about 8000 g/mol, the occurrence of ion migration was not observed, and the occurrence of ion migration was effectively reduced or prevented and excellent mountability was obtained. In the electronic component according to Comparative Example 7, the occurrence of ion migration was not observed, however, mountability was not satisfactory.

An electronic component, a method of manufacturing the same, and a mount structure of the electronic component according to a third preferred embodiment of the present invention will be described below. The electronic component, the method of manufacturing the same, and the mount structure of the electronic component according to the present preferred embodiment achieve good mountability with solder while the occurrence of ion migration is reduced or prevented, by providing a water-repellent film soluble in a solvent contained in a solder flux or an organic solvent. Description of features the same as or similar to those in the first preferred embodiment or the second preferred embodiment will not be repeated.

Third Preferred Embodiment

In the third preferred embodiment of the present invention, a water-repellent film is preferably composed, for example, of a resin. A water-repellent film is preferably composed, for example, of a silicone resin or a fluorine-based resin. A resin included in a water-repellent film is preferably a non-cross-linked resin. A non-cross-linked resin does not produce cross-linking reaction. With a non-cross-linked resin, a molecular weight of a resin is readily be controllable and a molecular weight is prevented from undesirably increasing. Therefore, a water-repellent film hardened by drying a non-cross-linked resin is soluble in an organic solvent or a solvent contained in a solder flux. A water-repellent film may be composed, for example, only of resin, or may be composed of a resin composition containing a filler. A water-repellent film is formed such that an angle of contact (a static angle of contact) of water of about 25° C. with the water-repellent film is not less than about 100°.

A solder member forming solder included in the mount structure of the electronic component includes solder and a solder flux. The solder flux contains a solvent. The solvent contained in the solder flux may be an aqueous solvent or an organic solvent. A preferred organic solvent is exemplified by an organic solvent including at least one selected from the group consisting of an ether-based organic solvent, an alcohol-based organic solvent, a hydrocarbon-based organic solvent, a ketone-based organic solvent, an ester-based organic solvent, and a glycol-ether-based organic solvent. A solubility parameter (an SP value) of the solvent contained in the solder flux is preferably, for example, from about 7.0 to about 14.0.

In the present preferred embodiment, a water-repellent resin soluble in a solvent contained in a solder flux is used for a water-repellent film. By using a solvent closer in solubility parameter (SP value) to the solvent contained in the solder flux as a solvent for diluting a resin for forming the water-repellent film, a highly homogenous treatment agent is provided. Therefore, a water-repellent film high in homogeneity is manufactured. The water-repellent film is soluble in the solvent contained in the solder flux during mounting of an electronic component. Therefore, when an electronic component is mounted, the water-repellent film located on a surface of a portion of the first and second external electrodes joined by solder is removed. Thus, no water-repellent film is provided at an interface between the first and second external electrodes and the solder in the mount structure of the electronic component. That is, no water-repellent film is provided at a junction between the electronic component and the mount substrate. Accordingly, direct contact between a solder melt and the first and second external electrodes is likely to occur. Thus, the first and second external electrodes and solder are suitably joined to each other. Therefore, the electronic component has excellent mount ability.

An Experimental Example 3 in which an influence of solubility of a water-repellent film in a solvent contained in a solder flux on each of whether or not ion migration in an electronic component occurs and mountability of an electronic component will be described below.

Experimental Example 3

In Experimental Example 3, seven types of electronic components and mount structures of the electronic components in Example 9 to Example 12 and Comparative Example 8 to Comparative Example 10 were fabricated. A stacked ceramic capacitor was fabricated as the electronic component.

Example 9

An electronic component and a mount structure of the electronic component according to Example 9 substantially the same as the electronic component according to the third preferred embodiment were fabricated under the conditions below. A dimension (a design value) of the electronic component was set to about 1.6 mm in length, about 0.8 mm in width, and about 0.8 mm in thickness. A ceramic portion was composed of $BaTiO_3$. The first and second internal electrodes were composed of Ni. The first electrode layer was made of a fired electrode layer containing Cu. The second electrode layer was made of a Ni plated layer. The third electrode layer was made of a Sn plated layer. A distance along the length direction between the first external electrode and the second external electrode in each of the first and second main surfaces was set to about 0.8 mm. A liquid obtained by diluting a silicone polymer dispersion liquid containing a non-cross-linked silicone resin (SD-8002 DISPERSION manufactured by Dow Corning Toray) such that a concentration of the non-cross-linked silicone resin was about 1 mass % was used as the treatment solution. For forming a water-repellent film, after the electronic component main body 10 including the first and second external electrodes was immersed in the treatment solution for about 5 minutes, the electronic component main body was taken out of the treatment solution and dried at about 150° C. for about 30 minutes. Consequently, a water-repellent film having a thickness of several nm was formed. The mount structure of the electronic component was fabricated by solder-mounting the electronic component on a substrate with the use of solder (96.5 Sn-3 Ag-0.5 Cu paste, M705-GRN360-K2-V manufactured by Senju Metal Industry Co., Ltd.).

Example 10

An electronic component and a mount structure of the electronic component according to Example 10 were fabricated as in Example 9 except that a concentration of the non-cross-linked silicone resin in the treatment solution was set to about 5 mass %.

Example 11

An electronic component and a mount structure of the electronic component according to Example 11 were fabricated as in Example 9 except that a concentration of the non-cross-linked silicone resin in the treatment solution was set to about 60 mass %.

Example 12

An electronic component and a mount structure of the electronic component according to Example 12 were fabricated as in Example 9 except that a water-repellent film was formed of a fluorine-based non-cross-linked resin coating liquid (WOP-019XPC manufactured by Noda Screen Co., Ltd.). The formed water-repellent film had a thickness of several nm.

Comparative Example 8

An electronic component and a mount structure of the electronic component according to Comparative Example 8 were fabricated as in Example 9 except that no water-repellent film was formed.

Comparative Example 9

An electronic component and a mount structure of the electronic component according to Comparative Example 9 were fabricated as in Example 9 except that a water-repellent film was formed using a treatment solution obtained by diluting an alkoxysilane-based silane coupling agent (KBM-3063 manufactured by Shin-Etsu Chemical Co., Ltd.) with propanol to about 5 volume %.

Comparative Example 10

An electronic component and a mount structure of the electronic component according to Comparative Example 10 were fabricated as in Example 9 except that a water-repellent film was formed using a silicone-based cross-linked polymer coating liquid (KR-400 manufactured by Shin-Etsu Chemical Co., Ltd.). The formed water-repellent film had a thickness of approximately 5 μm.

A measurement method and an evaluation method in the present Experimental Example will be described below. Ion migration and mountability were evaluated as in Experimental Example 1.

Evaluation of Solubility in Solvent Contained in Solder Flux

Whether or not the water-repellent film in the electronic component fabricated in each of Examples 9 to 12 and Comparative Examples 8 to 10 was dissolved in the solvent contained in the solder flux was evaluated. A case in which the fabricated electronic component was immersed in a solder flux containing about 25% of rosin and about 75% of propanol (flux F manufactured by Sasaki Chemical Co., Ltd.) and the water-repellent film was dissolved and removed was defined as "good" and a case in which no change was observed in the water-repellent film was defined as "bad". Here, the number of tested samples was set to n=10. Table 4 shows results of the present experiment.

TABLE 4

| | Solubility of Water-Repellent Film in Solvent Contained in Solder Flux | Ratio of Occurrence of Ion Migration | Ratio of Defective Mountability |
|---|---|---|---|
| Example 9 | good | 0/18 | 0/10 |
| Example 10 | good | 0/18 | 0/10 |
| Example 11 | good | 0/18 | 0/10 |
| Example 12 | good | 0/18 | 0/10 |
| Comparative Example 8 | — | 18/18 | 0/10 |
| Comparative Example 9 | bad | 16/18 | 0/10 |
| Comparative Example 10 | bad | 0/18 | 10/10 |

As shown in Table 4, it was confirmed that the water-repellent film containing a non-cross-linked silicone resin was dissolved in the solvent contained in the solder flux. It was confirmed that, in the electronic component including the water-repellent film dissolved in the solvent contained in the solder flux, the occurrence of ion migration was not observed, and the occurrence of ion migration could effectively be reduced or prevented and excellent mountability was obtained. In the electronic component according to Comparative Example 9, mountability was satisfactory, however, the occurrence of ion migration was observed. In the electronic component according to Comparative Example 10, the occurrence of ion migration was not observed, however, mountability was not satisfactory.

An electronic component, a method of manufacturing the same, and a mount structure of the electronic component according to a fourth preferred embodiment of the present invention will be described below. The electronic component, the method of manufacturing the same, and the mount structure of the electronic component according to the present preferred embodiment achieve good mountability with solder while the occurrence of ion migration is effectively reduced or prevented, by providing a water-repellent film defined by a silicone resin film having a thickness not greater than about 200 nm. Description of features the same as in the first to third preferred embodiments will not be repeated.

Fourth Preferred Embodiment

An electronic component according to the fourth preferred embodiment of the present invention includes a silicone resin film as a water-repellent film. The silicone resin film should only be a film containing a silicone resin. The silicone resin may be formed, for example, only of a silicone resin or of a silicone resin composition containing a filler.

When the inventors of the present invention actually fabricated an electronic component provided with a silicone resin film, in some cases, disadvantageously, electronic components adhered to each other when a plurality of electronic components were in contact with each other, and an electronic component was not detached from a suction and attraction mechanism when the electronic component was transported with the use of the suction and attraction mechanism. The inventors of the present invention discovered as a result of further dedicated studies that, by setting a thickness of a silicone resin film to about 200 nm or less, the adhesiveness of an electronic component was reduced, the problems described above were solved, and the mountability of the electronic component was improved.

In the electronic component according to the present preferred embodiment, a thickness of a silicone resin film preferably is set to about 200 nm, for example. Therefore, an adhesion force of an electronic component to another member is low. Accordingly, for example, adhesion of a plurality of electronic components to each other or difficulty in detachment thereof from a suction and attraction mechanism are effectively prevented. In order to further reduce the adhesion force of an electronic component to another member, a silicone resin film has a thickness preferably not greater than about 100 nm, for example. When the thickness of a silicone resin film is too small, the occurrence of ion migration may not be sufficiently reduced or prevented. Therefore, the silicone resin film has a thickness preferably not less than about 1 nm. A thickness of a silicone resin film can be controlled, for example, by appropriately adjusting a concentration of a silicone resin in a treatment agent.

A silicone resin film can be formed, for example, in the following manner. Initially, a treatment agent is prepared by diluting a silicone resin by adding a solvent such as a paraffin-based solvent thereto. In the treatment agent, a concentration of the silicone resin can be, for example, from about 0.01 mass % to about 10 mass %. Then, an electronic component main body including the first and second external electrodes provided thereon is immersed in the treatment agent, for example, for approximately 1 to 10 minutes. Thereafter, a silicone resin film can be formed, for example, by drying the electronic component main body in a heated atmosphere from about 100° C. to about 200° C. for approximately 10 to 60 minutes, for example.

An Experimental Example 4 in which the influence of a thickness of a silicone resin film on each of whether or not ion migration in an electronic component occurs and adhesive force of a water-repellent film (mountability of an electronic component) will be described below.

Experimental Example 4

In Experimental Example 4, six types of electronic components and mount structures of the electronic components in Example 13 to Example 15 and Comparative Example 11 to Comparative Example 13 were fabricated. A stacked ceramic capacitor was fabricated as the electronic component.

Example 13

An electronic component and a mount structure of the electronic component according to Example 13 that are the same or substantially the same as the electronic component according to the fourth preferred embodiment were fabricated under the conditions below. A dimension (a design value) of the electronic component was set to about 1.6 mm in length, about 0.8 mm in width, and about 0.8 mm in thickness. A ceramic portion was composed of $BaTiO_3$. The first and second internal electrodes were composed of Ni. The first electrode layer was made of a fired electrode layer containing Cu. The second electrode layer was made of a Ni plated layer. The third electrode layer was made of a Sn plated layer. A distance along the length direction between the first external electrode and the second external electrode in each of the first and second main surfaces was set to about 0.8 mm. A concentration of a silicone resin in a treatment solution was set to about 0.008 mass %. For forming the water-repellent film 20, immersion of the electronic component main body including the first and second external electrodes provided thereon in the treatment solution and drying thereof were repeated seven times. A formed water-repellent film had a thickness of about 60 nm. The mount structure of the electronic component was fabricated by solder-mounting the electronic component on a substrate with the use of solder (96.5 Sn-3 Ag-0.5 Cu paste, M705-GRN360-K2-V manufactured by Senju Metal Industry Co., Ltd.).

Example 14

An electronic component and a mount structure of the electronic component according to Example 14 were fabricated as in Example 13 except that a concentration of a silicone resin in the treatment solution was set to about 0.01 mass %. The water-repellent film had a thickness of about 90 nm.

Example 15

An electronic component and a mount structure of the electronic component according to Example 15 were fabricated as in Example 13 except that a concentration of a silicone resin in the treatment solution was set to about 0.013 mass %. The water-repellent film had a thickness of about 100 nm.

Comparative Example 11

An electronic component and a mount structure of the electronic component according to Comparative Example 11 were fabricated as in Example 13 except that a concentration of a silicone resin in the treatment solution was set to about 0.042 mass %. The water-repellent film had a thickness of about 300 nm.

Comparative Example 12

An electronic component and a mount structure of the electronic component according to Comparative Example 12 were fabricated as in Example 13 except that a concentration of a silicone resin in the treatment solution was set to about 0.057 mass %. The water-repellent film had a thickness of about 500 nm.

Comparative Example 13

An electronic component and a mount structure of the electronic component according to Comparative Example 13 were fabricated as in Example 13 except that a water-repellent film was formed with the use of a treatment solution obtained by diluting an alkoxysilane-based silane coupling agent (KBM-3063 manufactured by Shin-Etsu Chemical Co., Ltd.) with propanol to about 10 volume %.

A measurement method and an evaluation method in the present Experimental Example will be described below. A method of measuring a thickness and evaluation of ion migration were the same as in Experimental Example 1.

Evaluation of Adhesive Force of Water-Repellent Film

Two electronic components fabricated in each of Examples 13 to 15 and Comparative Examples 11 to 13 were sandwiched such that first main surfaces thereof were opposed to each other, a pressure of about 5N was applied thereto in a direction of a thickness thereof, and thereafter, the two electronic components were dropped onto a base from a height of about 2 cm above the base. A case in which the two electronic components were separated as a result of dropping was evaluated as low in adhesive force or "good". A case in which the two electronic components were not separated after dropping was evaluated as high in adhesive force or "bad". This evaluation of adhesive force was conducted 100 times for each of Examples 13 to 15 and Comparative Examples 11 to 13. Table 5 shows the number of times of evaluation as "bad" in evaluation of adhesive force which was conducted 100 times.

TABLE 5

|  | Thickness of Silicone Resin Film (nm) | Ratio of Occurrence of Ion Migration | Ratio of Defective Adhesive Force of Water-Repellent Film (Ratio of Defective Mountability) |
| --- | --- | --- | --- |
| Example 13 | 60 | 0/18 | 0/100 |
| Example 14 | 90 | 0/18 | 0/100 |
| Example 15 | 100 | 0/18 | 1/100 |
| Comparative Example 11 | 300 | 0/18 | 15/100 |
| Comparative Example 12 | 500 | 0/18 | 60/100 |
| Comparative Example 13 | 100 | 16/18 | 0/100 |

As shown in Table 5, it was confirmed that, within a range of a thickness of a silicone resin film not greater than about 100 nm, the occurrence of ion migration was effectively reduced or prevented, the adhesive force of a water-repellent film was low, and excellent mountability was obtained. In the electronic components according to Comparative Examples 11 and 12, the occurrence of ion migration was not observed, however, the adhesive force of a water-repellent film was high and the mountability was not satisfactory. In the electronic component according to Comparative Example 13, the mountability was satisfactory, however, the occurrence of ion migration was observed.

In each of the first to fourth preferred embodiments and Examples 1 to 15 above, features can be combined with each other as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component, comprising:
   an electronic component main body;
   first and second external electrodes provided on a portion of a surface of the electronic component main body; and
   a water-repellent film provided on another portion of the surface of the electronic component main body and on a surface of the first external electrode, and containing a non-cross-linked silicone resin; wherein
   an angle of contact of water of about 25° C. with the water-repellent film is not less than about 100° and not greater than about 160°.

2. The electronic component according to claim 1, wherein each of the first and second external electrodes includes a plurality of layers, and an outermost layer of each of the first and second external electrodes contains at least one of Sn, Cu, and Ag.

3. The electronic component according to claim 1, wherein the electronic component main body includes first and second main surfaces extending along a length direction and a width direction, first and second side surfaces extending along the length direction and a thickness direction, and first and second end surfaces extending along the width direction and the thickness direction;
   on the second main surface, a tip end portion of the first external electrode and a tip end portion of the second external electrode are opposed to each other in the length direction; and
   the water-repellent film is located on a portion of the second main surface, which is located between the tip end portion of the first external electrode and the tip end portion of the second external electrode.

4. The electronic component according to claim 1, wherein the water-repellent film extends across the another portion of the surface of the electronic component main body and the surface of the first external electrode.

5. The electronic component according to claim 1, wherein the water-repellent film covers an entire surface of an exposed portion of the electronic component main body and each of the first and second external electrodes.

6. A mount structure of an electronic component, comprising:
   the electronic component according to claim 1;
   a mount substrate on which the electronic component is mounted; and
   solder joining the electronic component and the mount substrate to each other.

* * * * *